United States Patent
Kohashi et al.

(10) Patent No.: US 12,400,827 B2
(45) Date of Patent: Aug. 26, 2025

(54) CHARGED PARTICLE BEAM DEVICE

(71) Applicant: Hitachi High-Tech Corporation, Tokyo (JP)

(72) Inventors: Teruo Kohashi, Tokyo (JP); Hideo Morishita, Tokyo (JP); Tatsuro Ide, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 420 days.

(21) Appl. No.: 18/016,104

(22) PCT Filed: Sep. 28, 2020

(86) PCT No.: PCT/JP2020/036526
§ 371 (c)(1),
(2) Date: Jan. 13, 2023

(87) PCT Pub. No.: WO2022/064668
PCT Pub. Date: Mar. 31, 2022

(65) Prior Publication Data
US 2023/0274907 A1  Aug. 31, 2023

(51) Int. Cl.
*H01J 37/26* (2006.01)

(52) U.S. Cl.
CPC .......... *H01J 37/268* (2013.01); *H01J 37/265* (2013.01); *H01J 2237/24557* (2013.01); *H01J 2237/30416* (2013.01)

(58) Field of Classification Search
CPC .......... H01J 37/00; H01J 37/02; H01J 37/268; H01J 37/265; H01J 37/26; H01J 37/28;
(Continued)

(56) References Cited

U.S. PATENT DOCUMENTS

2009/0242792 A1* 10/2009 Hosoya ................. H01J 37/222
                                                                                                 250/397
2016/0118219 A1   4/2016 Potocek et al.
2021/0074509 A1* 3/2021 Morishita ............... H01J 37/18

FOREIGN PATENT DOCUMENTS

JP          06-103950 A       4/1994
JP         2011-095150 A      5/2011
(Continued)

OTHER PUBLICATIONS

Akito Kakizaki, "Spin-split Electronic Structures Observed by Spin-Resolved Photoemission", Journal of the Vacuum Society of Japan, 2012, vol. 55, No. 5, pp. 209-214.
(Continued)

*Primary Examiner* — Jason L McCormack
(74) *Attorney, Agent, or Firm* — MATTINGLY & MALUR, PC (57) ABSTRACT

To implement a charged particle beam device including an iron thin film spin detector. The charged particle beam device includes: a charged particle column 201 configured to perform scanning on a sample 203 with a charged particle beam 202; a spin detector including an iron thin film 207, a plurality of coils 208 configured to magnetize the iron thin film, a conveying lens 206 configured to focus, on the iron thin film, secondary electrons 204 emitted from the sample due to irradiation of the charged particle beam, and an electron detector 210 configured to detect backscattered electrons 209 emitted due to the iron thin film being irradiated with the secondary electrons; and a control unit 217 configured to control switching of a magnetization direction of the iron thin film in synchronization with scanning of one line with the charged particle beam from the charged particle column.

18 Claims, 10 Drawing Sheets

(58) Field of Classification Search
CPC ........... H01J 37/244; H01J 2237/24557; H01J 2237/30416; H01J 2237/24564
USPC ........................................ 250/306, 307, 311
See application file for complete search history.

(56) References Cited

FOREIGN PATENT DOCUMENTS

JP    2016-085966 A    5/2016
WO   WO-2019224919 A1 * 11/2019  ......... G01N 23/2251

OTHER PUBLICATIONS

Taichi Okuda et al., "A double VLEED spin detector for high-resolution three dimensional spin vectorial analysis of anisotropic Rashba spin splitting", Journal of Electron Spectroscopy and Related Phenomena, vol. 201, 2015, pp. 23-29.
International Search Report of PCT/JP2020/036526 dated Nov. 2, 2020.

* cited by examiner

| MAGNETIZATION OF IRON THIN FILM / SCANNING ORDER | RIGHTWARD ➡ | LEFTWARD ⬅ | UPWARD ⬆ | DOWNWARD ⬇ |
|---|---|---|---|---|
| 1 | FIRST LINE | | | |
| 2 | SECOND LINE | | | |
| ⋮ | ⋮ | | | |
| 256 | 256-TH LINE | | | |
| SWITCH MAGNETIZATION OF IRON THIN FILM ||||| 
| 257 | | FIRST LINE | | |
| 258 | | SECOND LINE | | |
| ⋮ | | ⋮ | | |
| 512 | | 256-TH LINE | | |
| SWITCH MAGNETIZATION OF IRON THIN FILM |||||
| 513 | | | FIRST LINE | |
| 514 | | | SECOND LINE | |
| ⋮ | | | ⋮ | |
| 768 | | | 256-TH LINE | |
| SWITCH MAGNETIZATION OF IRON THIN FILM |||||
| 767 | | | | FIRST LINE |
| 768 | | | | SECOND LINE |
| ⋮ | | | | ⋮ |
| 1024 | | | | 256-TH LINE |

| SCANNING ORDER \ MAGNETIZATION OF IRON THIN FILM | RIGHTWARD ➡ | LEFTWARD ⬅ | UPWARD ⬆ | DOWNWARD ⬇ |
|---|---|---|---|---|
| 1 | FIRST LINE | | | |
| 2 | | FIRST LINE | | |
| 3 | | | FIRST LINE | |
| 4 | | | | FIRST LINE |
| 5 | SECOND LINE | | | |
| 6 | | SECOND LINE | | |
| 7 | | | SECOND LINE | |
| 8 | | | | SECOND LINE |
| ⋮ | | | | |
| 1021 | 256-TH LINE | | | |
| 1022 | | 256-TH LINE | | |
| 1023 | | | 256-TH LINE | |
| 1024 | | | | 256-TH LINE |

| MAGNETIZATION OF IRON THIN FILM / SCANNING ORDER | RIGHTWARD ➡ | LEFTWARD ⬅ | UPWARD ⬆ | DOWNWARD ⬇ |
|---|---|---|---|---|
| 1 | FIRST LINE | | | |
| 2 | | SECOND LINE | | |
| 3 | | | THIRD LINE | |
| 4 | | | | FOURTH LINE |
| 5 | FIFTH LINE | | | |
| 6 | | SIXTH LINE | | |
| 7 | | | SEVENTH LINE | |
| 8 | | | | EIGHTH LINE |
| ⋮ | | | | |
| 253 | 253-TH LINE | | | |
| 254 | | 254-TH LINE | | |
| 255 | | | 255-TH LINE | |
| 256 | | | | 256-TH LINE |

[FIG. 8]

| SCANNING ORDER / MAGNETIZATION OF IRON THIN FILM | RIGHTWARD ➡ | LEFTWARD ⬅ | UPWARD ⬆ | DOWNWARD ⬇ |
|---|---|---|---|---|
| 1 | FIRST LINE | | | |
| 2 | | FIRST LINE | | |
| 3 | SECOND LINE | | | |
| 4 | | SECOND LINE | | |
| 5 | THIRD LINE | | | |
| 6 | | THIRD LINE | | |
| ⋮ | | | | |
| 511 | 255-TH LINE | | | |
| 512 | | 256-TH LINE | | |
| ACQUIRE SPIN IMAGE (X COMPONENT IMAGE), AND CALCULATE SPIN ABSOLUTE VALUE IMAGE (Y COMPONENT IMAGE) | | | | |
| 513 | | | FIRST LINE | |
| 514 | | | | FIRST LINE |
| 515 | | | NINTH LINE | |
| 516 | | | | NINTH LINE |
| ⋮ | | | | |
| 573 | | | 241-TH LINE | |
| 574 | | | | 241-TH LINE |
| 575 | | | 249-TH LINE | |
| 576 | | | | 249-TH LINE |
| GIVE SIGN TO EACH MAGNETIC DOMAIN OF SPIN ABSOLUTE VALUE IMAGE (Y COMPONENT IMAGE), AND CREATE SPIN IMAGE (Y COMPONENT IMAGE) | | | | |

801 brackets rows 1–512; 802 brackets rows 513–576.

| MAGNETIZATION OF IRON THIN FILM / SAMPLING ORDER | RIGHTWARD ➡ | LEFTWARD ⬅ | UPWARD ⬆ | DOWNWARD ⬇ |
|---|---|---|---|---|
| 1 | (1, A) | | | |
| 2 | | (1, A) | | |
| 3 | | | (1, A) | |
| 4 | | | | (1, A) |
| 5 | (1, B) | | | |
| 6 | | (1, B) | | |
| 7 | | | (1, B) | |
| 8 | | | | (1, B) |
| ⋮ | | | | |

CHARGED PARTICLE BEAM DEVICE

TECHNICAL FIELD

The present disclosure relates to a charged particle beam device including a spin detector.

BACKGROUND ART

As one of surface analyzers using a spin detector, PTL 1 discloses a spin-polarized scanning electron microscope (SEM). The spin-polarized SEM is a combination of a function of a spin detector that measures a spin direction and an intensity (a spin polarization) of an electron beam and a function of an SEM that generates a microscopic image of a surface of a sample by using the electron beam, and is capable of imaging a magnetization structure of the sample with the SEM by using the spin polarization calculated by the spin detector. The spin detector disclosed in PTL 1 has a target to be irradiated with secondary electrons emitted from the sample. The secondary electrons emitted from the sample have a spin polarization corresponding to magnetization of an irradiation position of a primary electron beam. When the secondary electrons collide with the target and are scattered, a slight bias occurs in scattering directions due to a difference in positive and negative spins. The spin detector detects the bias by four electron detectors arranged on all sides of the target.

Meanwhile, in a spin-resolved photoelectron spectroscopic technique, a spin detection method using an iron thin film is known.

CITATION LIST

Patent Literature

PTL 1: JP2011-95150A

SUMMARY OF INVENTION

Technical Problem

In PTL 1, the intensity of electrons detected by the electron detector of the spin detector is extremely weak and an asymmetry of spin polarization is also slight, and thus in order to improve an SN ratio, the target is a target in which a plurality of minute protrusions are formed on a main surface and a thin film made of heavy elements such as gold is formed on the main surface and the protrusions. In contrast, the present inventors have considered applying a highly efficient spin detection method in which an iron thin film is used as a spin detector for an SEM. Here, a detector that performs a spin detection by using the iron thin film is called an iron thin film spin detector.

A principle for detecting a spin polarization by the iron thin film spin detector will be described with reference to FIG. 1. In a first state 100a, a magnetization direction 102a of an iron thin film 101 is a leftward direction of the drawing surface, and in a second state 100b, a magnetization direction 102b of the iron thin film 101 is a rightward direction of the drawing surface.

Figure 1:
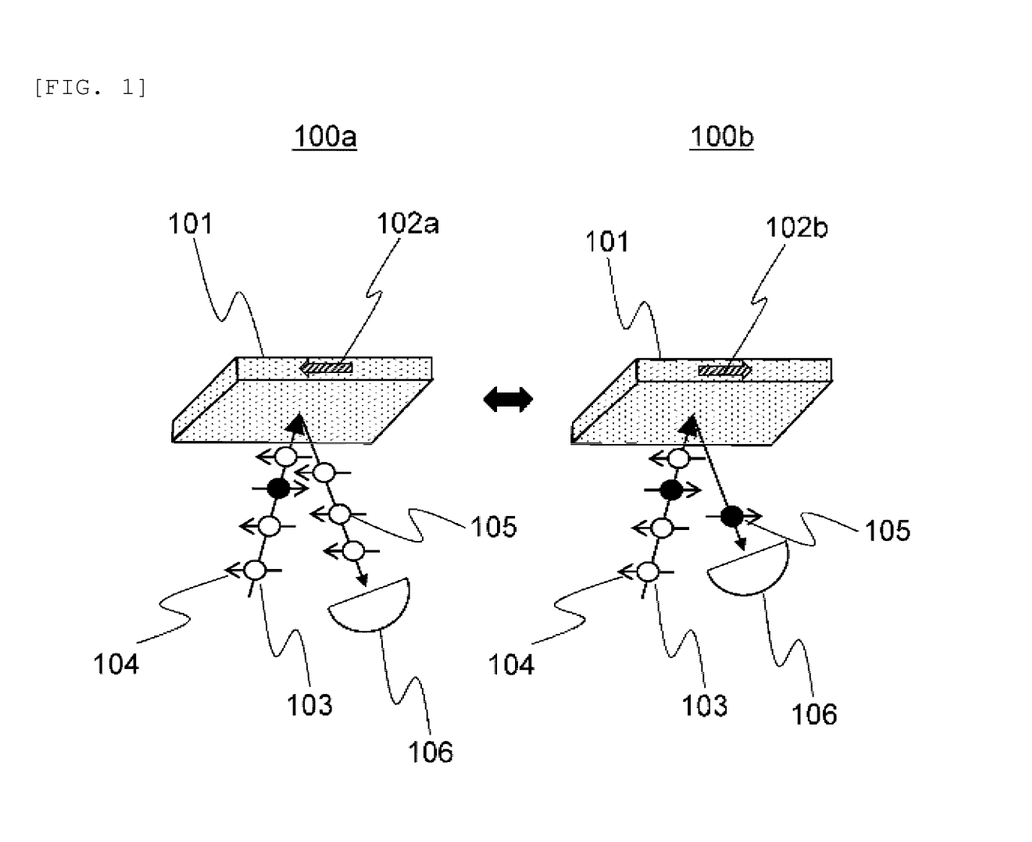
FIG. 1 is a diagram illustrating a principle for detecting a spin polarization by an iron thin film spin detector.

FIG. 1 indicates a state in which the iron thin film 101 is irradiated with electrons to be measured 103, and a direction of a spin 104 for each electron to be measured 103 is schematically indicated by an arrow. In the figure, electrons having different spin directions are indicated by white circles and black circles, and in an electron beam to be measured, the number of electrons 103 indicated by the white circles and the number of electrons 103 indicated by the black circles are different. A bias of the numbers of two types of electrons having different spin directions corresponds to the spin polarization. If the first state 100a is a state in which the electrons indicated by the black circles are likely to be taken into the iron thin film, the second state 100b in which the magnetization direction of the iron thin film 101 is reversed is changed to a state in which the electrons indicated by the white circles having an opposite spin direction are likely to be taken into the iron thin film. For this reason, when backscattered electrons 105 emitted due to the iron thin film 101 being irradiated with the electrons to be measured 103 are detected by an electron detector 106, a detection amount depends on the number of the electrons indicated by the white circles in the electron beam to be measured in the first state 100a, and depends on the number of the electrons indicated by the black circles in the electron beam to be measured in the second state 100b. As described above, the iron thin film spin detector detects the spin polarization of the electron beam to be measured by utilizing the fact that a reflectance of the electrons to be measured changes depending on a relative relation between the magnetization direction of the iron thin film and a spin direction of the electron beam to be measured.

The present invention proposes a charged particle beam device including such an iron thin film spin detector.

Solution to Problem

A charged particle beam device includes: a charged particle column configured to perform scanning on a sample with a charged particle beam; a spin detector including an iron thin film, a plurality of coils configured to magnetize the iron thin film, a conveying lens configured to focus, on the iron thin film, secondary electrons emitted from the sample due to irradiation of the charged particle beam, and an electron detector configured to detect backscattered electrons emitted due to the iron thin film being irradiated with the secondary electrons; and a control unit configured to control switching of a magnetization direction of the iron thin film in synchronization with scanning of one line with the charged particle beam from the charged particle column.

Advantageous Effects of Invention

A charged particle beam device including an iron thin film spin detector is implemented.

Other problems and novel features will become apparent from a description of the present specification and accompanying drawings.

DESCRIPTION OF EMBODIMENTS

Hereinafter, embodiments of the invention will be described. The drawings illustrated in the present embodiment illustrate specific embodiments according to a principle of the invention, but the embodiments are provided for a purpose of understanding the invention, and are not to be used for limiting interpretation of the invention. In the following embodiments, an SEM using electrons as a charged particle source will be described as an example, but the same effect can be achieved even when various ions are used as the charged particle source.

Figure 2:
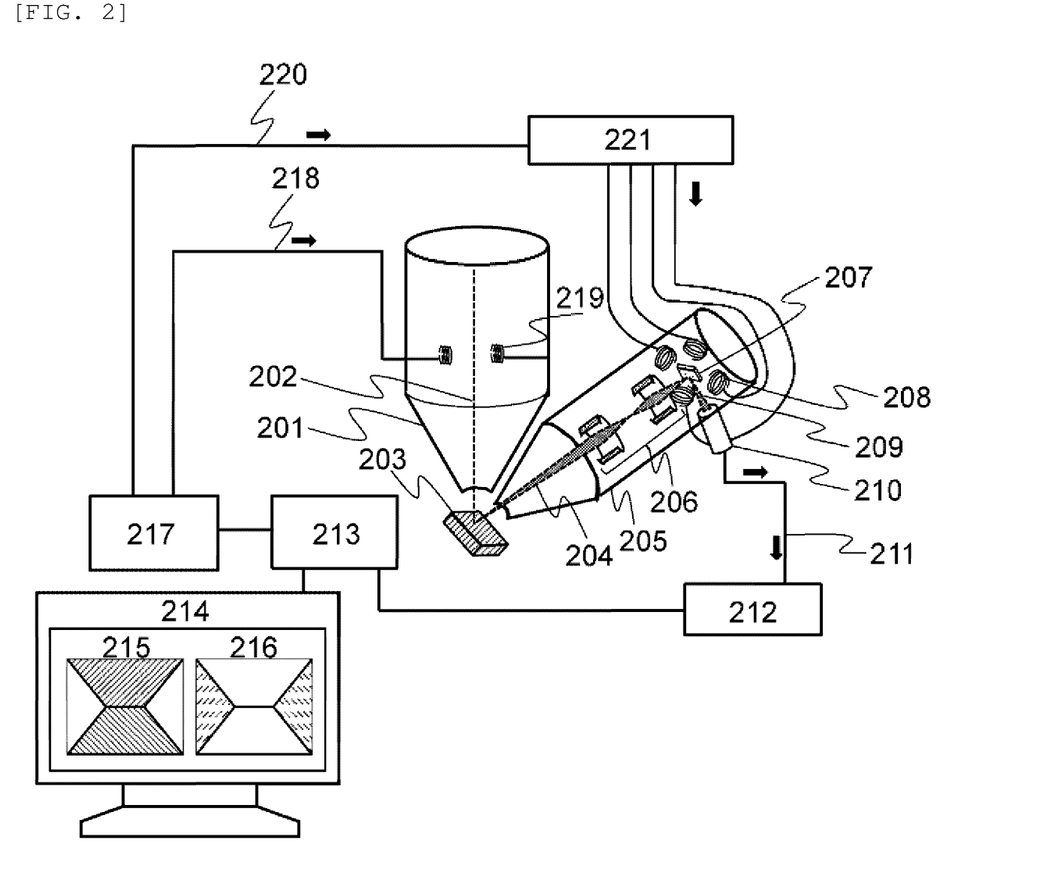
FIG. 2 is a schematic configuration diagram of an SEM including an iron thin film spin detector.

FIG. 2 illustrates a schematic configuration of an SEM including an iron thin film spin detector. A main configuration includes an electron gun column 201 that emits a primary electron beam 202 to a sample 203, an iron thin film spin detector that detects backscattered electrons 209 emitted when an iron thin film 207 is irradiated with a secondary electron flux 204 emitted from the sample 203 due to the irradiation with the primary electron beam 202, and a data analysis unit 213 that creates a spin image of the sample 203 based on a detection signal 211 from the iron thin film spin detector.

The electron gun column 201 includes scanning coils 219 for scanning the sample 203 with the primary electron beam 202. The scanning coil 219 is controlled by a scanning signal 218 from a control unit 217, and the sample 203 is scanned with the primary electron beam 202.

The sample 203, which is an observation target, includes magnetic domains having different sizes and magnetization directions, and spins of electrons inside the sample are polarized according to the magnetic domains. In order to detect the magnetization direction for each magnetic domain, it is necessary to obtain an X component and a Y component of magnetization (an X direction and a Y direction are perpendicular to each other). Assuming that the X component is obtained by a first state 100a and a second state 100b illustrated in FIG. 1, the Y component is obtained by controlling magnetization of an iron thin film 101 in a direction different from a magnetization direction 102 in a main surface of the iron thin film (for example, a perpendicular direction) in the same manner as in the magnetization direction 102.

The iron thin film spin detector focuses the secondary electron flux 204 on the iron thin film 207 by secondary electron transfer lenses 206 built in a spin detector chamber 205. The backscattered electrons 209 emitted due to the irradiation of the iron thin film 207 with the secondary electrons are detected by an electron detector 210. The detection signal 211 is converted into a digital signal by an AD converter 212, and is output to the data analysis unit 213. As described above, since it is necessary to switch a magnetization direction of the iron thin film 207 in order to obtain the magnetization direction of the magnetic domain, a plurality of coils 208 are arranged with respect to the iron thin film 207. In this example, four coils 208 are arranged with respect to the iron thin film 207, and the magnetization direction of the iron thin film 207 can be switched in four directions, that is, leftward, rightward, upward, and downward directions. The magnetization direction is switched by independently controlling generation of a magnetic field due to the plurality of coils 208 by an iron thin film magnetization control power supply 221 that supplies an excitation current to the plurality of coils 208 individually. As will be described later, in the present embodiment, in order to synchronize the switching control of the magnetization direction of the iron thin film 207 with the scanning with the primary electron beam, the control unit 217 controls the iron thin film magnetization control power supply 221 by an iron thin film magnetization control signal 220 synchronized with the scanning signal 218 for controlling the scanning coil 219 of the electron gun column 201.

The spin image of the sample 203 created by the data analysis unit 213 can be displayed on a display device 214. The spin image is displayed as an X component image 215 and a Y component image 216 of the magnetization for each component.

Figure 3:
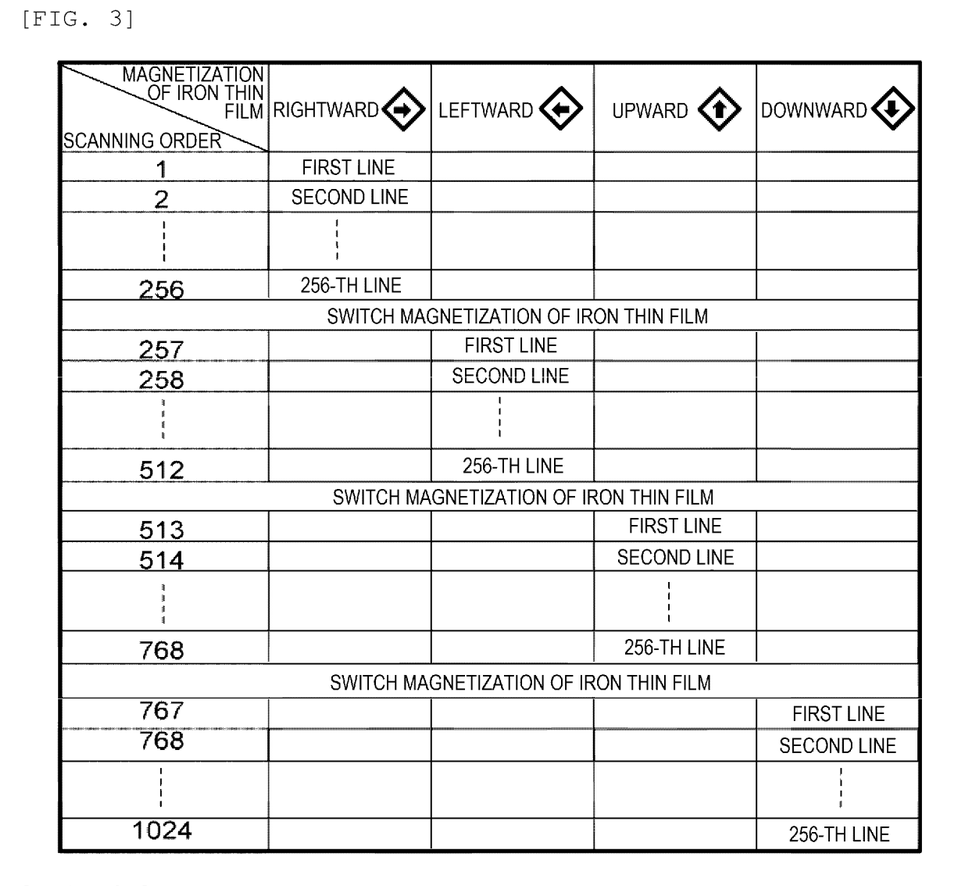
FIG. 3 is a diagram illustrating a spin image acquisition method according to a comparative example.

A spin image acquisition method according to a comparative example will be described with reference to FIG. 3. The comparative example is a method in which magnetization control of an iron thin film and scanning on a sample are not synchronized, and a magnetization direction of the iron thin film is switched every time one image is acquired (in the example illustrated in FIG. 3, one image is acquired by scanning an observation visual field for 256 lines). Specifically, in order to obtain an X component of the magnetization, the observation visual field is scanned twice while switching the magnetization direction of the iron thin film leftward and rightward, and subsequently, in order to obtain a Y component of the magnetization of a magnetic domain of the sample, the observation visual field is scanned twice while switching the magnetization direction of the iron thin film upward and downward. Accordingly, the X component and the Y component of the magnetization for each magnetic domain included in the observation visual field can be obtained.

Figure 4A:
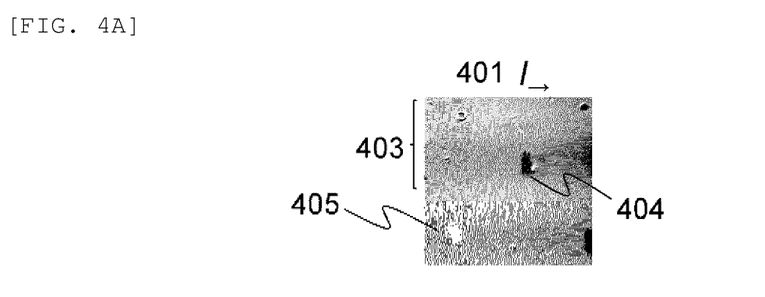
FIG. 4A is a schematic diagram of a first backscattered electron image in the comparative example.
Figure 4B:
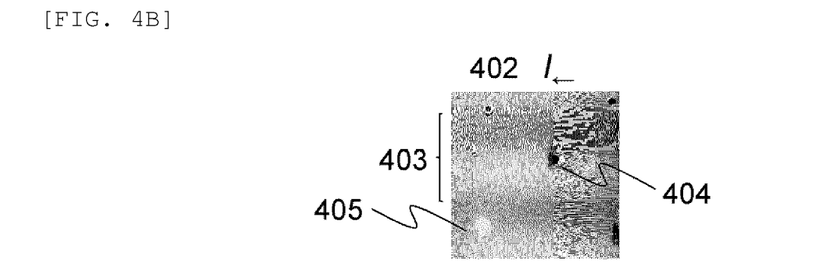
FIG. 4B is a schematic diagram of a second backscattered electron image in the comparative example.
Figure 4C:
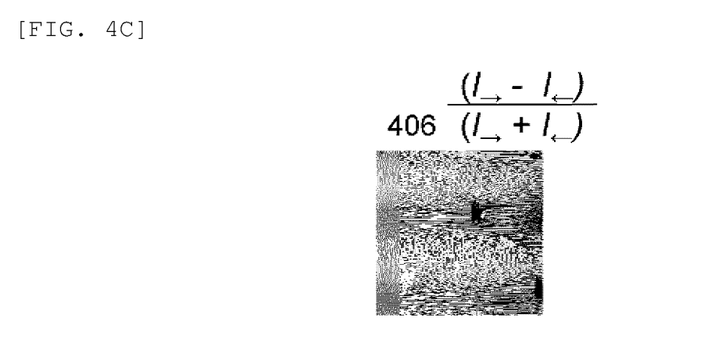
FIG. 4C is a schematic diagram of a spin image (an X component image) in the comparative example.

FIG. 4A schematically illustrates a first backscattered electron image 401 in a case in which the magnetization direction of the iron thin film 207 obtained by first to 256-th scanning is a rightward direction. FIG. 4B schematically illustrates a second backscattered electron image 402 in a case in which the magnetization direction of the iron thin film 207 obtained by 257-th to 512-th scanning is a leftward direction. FIG. 4C schematically illustrates a spin image (an X component image) 406 created based on the backscattered electron image 401 and the backscattered electron image 402. A pixel value of the spin image 406 can be obtained by a calculation of dividing a difference between a pixel value of the first backscattered electron image 401 and a pixel value of the second backscattered electron image 402 by a sum of the pixel value of the first backscattered electron image 401 and the pixel value of the second backscattered electron image 402. A spin image (a Y component image) can also be obtained by the same calculation based on a third backscattered electron image in a case in which the magnetization direction of the iron thin film 207 is an upward direction and a fourth backscattered electron image in a case in which the magnetization direction of the iron thin film 207 is a downward direction.

An intensity of the secondary electron flux 204 emitted to the iron thin film 207 fluctuates under influences of a surface shape of the sample 203 and other noise. In the example illustrated in FIG. 1, a total number of electrons to be measured 103 emitted to the iron thin film 207 is different for each irradiation position of the primary electron beam 202 due to these influences. For this reason, information other than the spin, such as the shape of the sample need to be cancelled in the calculation.

For example, periodic noise 403, a defect on a sample surface 404, and a foreign matter on a sample surface 405 are shown in the backscattered electron images 401 and 402, but they are cancelled in the calculation in the spin image 406. However, as illustrated in FIG. 4C, it was found that also in the spin image 406, spin information was buried in these influences and may not be distinguished. A cause of this is presence of drift and background noise due to an overtime change during acquisition of the two backscattered electron images, which cannot be cancelled in the calculation.

In the first backscattered electron image 401 and the second backscattered electron image 402, there is a time interval for scanning with the primary electron beam 202 for 256 lines until the primary electron beam 202 is emitted to the same position of the sample 203. Accordingly, for example, when a signal amplifier that amplifies the signal of the electron detector 210 has long-term periodic noise, magnitudes of the noise at the same pixel position in the first backscattered electron image 401 and the second backscattered electron image 402 are different, and thus noise information cannot be cancelled. Alternatively, if there is a deviation between a scanning range when acquiring the first backscattered electron image 401 and a scanning range when acquiring the second backscattered electron image 402, positions of surface information in the two backscattered electron images are different from each other, and thus sample shape information cannot be cancelled. As described above, information other than the spin information that cannot be cancelled in the calculation increases, and as a result, originally weak spin information is buried and cannot be distinguished.

First Embodiment

Figure 5:
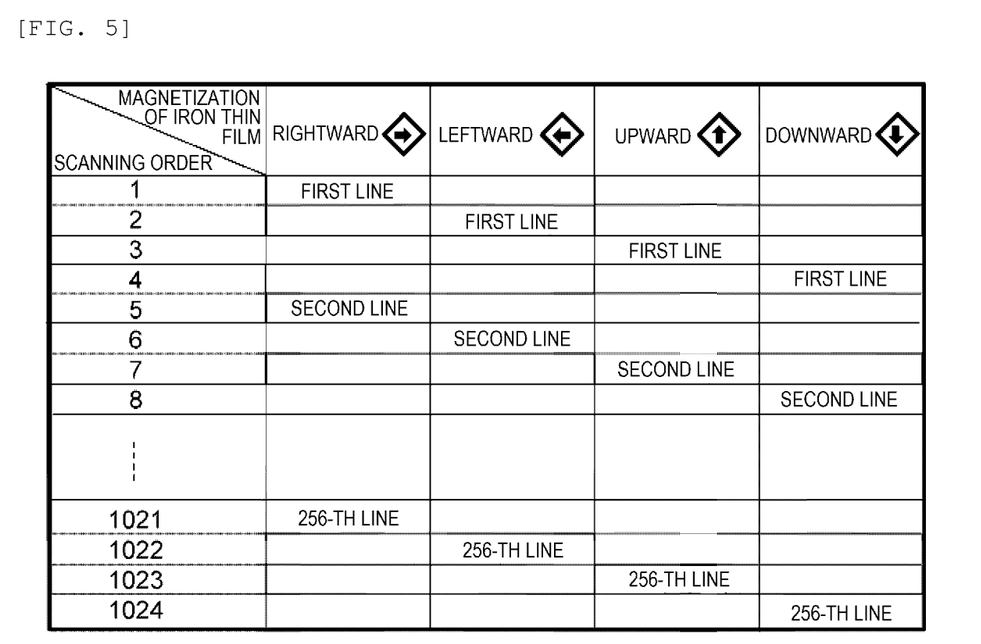
FIG. 5 is a diagram illustrating a spin image acquisition method according to a first embodiment.
Figure 6A:
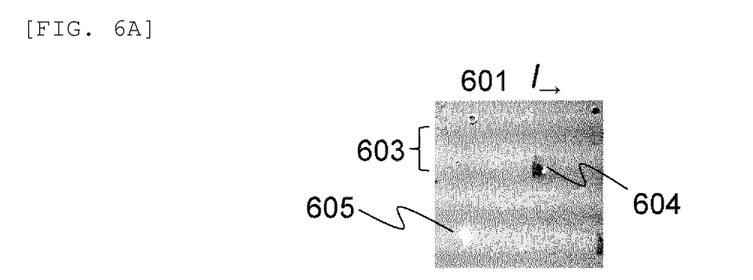
FIG. 6A is a schematic diagram of a first backscattered electron image in the first embodiment.
Figure 6B:
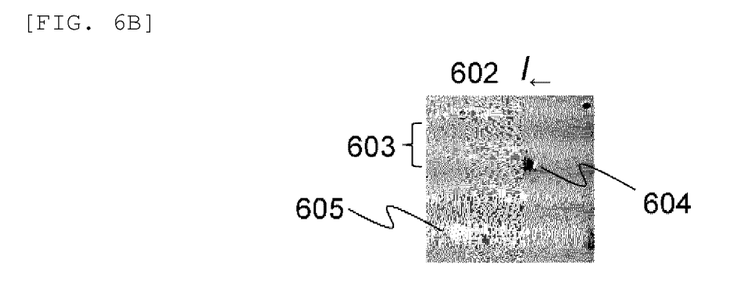
FIG. 6B is a schematic diagram of a second backscattered electron image in the first embodiment.
Figure 6C:
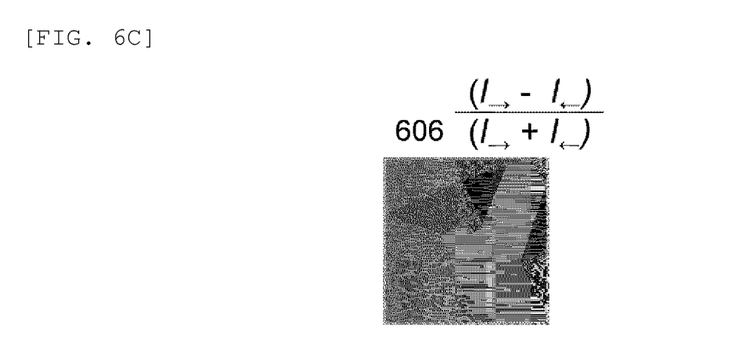
FIG. 6C is a schematic diagram of a spin image (an X component image) in the first embodiment.

A spin image acquisition method according to a first embodiment will be described with reference to FIG. 5. In the first embodiment, magnetization control of an iron thin film and line scanning on a sample are synchronized, and scanning of one line is repeated at the same position while switching a magnetization direction of the iron thin film. In the spin image acquisition method according to the first embodiment, FIG. 6A schematically illustrates a first backscattered electron image 601 in a case in which the magnetization direction of the iron thin film 207 is a rightward direction, FIG. 6B schematically illustrates a second backscattered electron image 602 in a case in which the magnetization direction of the iron thin film 207 is a leftward direction, and FIG. 6C schematically illustrates a spin image (an X component image) 606 created based on the backscattered electron image 601 and the backscattered electron image 602.

According to the method of the first embodiment, in the first backscattered electron image 601 and the second backscattered electron image 602, a time interval until the primary electron beam 202 is emitted to the same position of the sample 203 is only time for one-line scanning with the primary electron beam 202. Accordingly, periodic noise 603 and shape images on a sample surface 604 and 605 included in the backscattered electron images can be removed without being influenced by an overtime change, and a spin image with a high S/N ratio such as the spin image 606 can be obtained. In the spin image 606, a spin polarization of the secondary electron flux 204, that is, an intensity (including positive and negative signs) of the magnetization in an X direction at an irradiation position of the primary electron beam 202 is displayed as contrast.

Second Embodiment

In a second embodiment described below, first to fourth backscattered electron images obtained by scanning on the sample 203 with the primary electron beam 202 are images subjected to thinning-out scanning, and an S/N ratio is lower than that of the spin image obtained by the spin image acquisition method according to the first embodiment, but since an image acquisition time can be shortened, the second embodiment is effective when priority is given to quickly understanding a magnetic domain structure of the sample 203.

Figure 7:
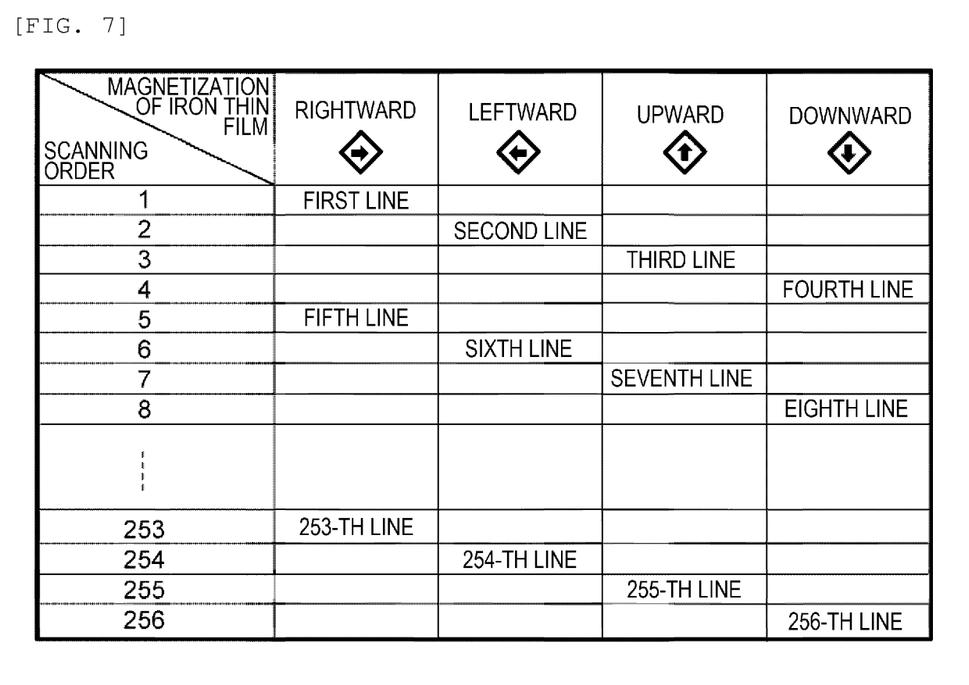
FIG. 7 is a diagram illustrating a spin image acquisition method according to a second embodiment.

A spin image acquisition method according to the second embodiment will be described with reference to FIG. 7. The second embodiment is the same as the first embodiment in that magnetization control of an iron thin film and scanning on a sample are synchronized and a magnetization direction of the iron thin film is switched for scanning of every line, but scanning of the same line is not performed a plurality of times, and an observation visual field is scanned while a position is shifted. As a result, as compared with the first embodiment, first to fourth backscattered electron images having different magnetization directions, for which the number of lines of scanning is reduced to ¼, are obtained, and thus a spin image (an X component image) is obtained based on the first and second backscattered electron images, and a spin image (a Y component image) is obtained based on the third and fourth backscattered electron images.

In the second embodiment, in order to obtain the spin image, for example, a difference between an image of a first line of the first backscattered electron image and an image of a second line of the second backscattered electron image is taken, and sample shape information cannot be completely canceled. However, there is no visual field deviation between the first backscattered electron image and the second backscattered electron image, and it can be expected that the sample shape information included in the image of the first line and the sample shape information included in the image of the second line which is adjacent to the first line, are substantially the same in many cases.

Since the number of lines of scanning is thinned out for the backscattered electron image, it is necessary to interpolate a pixel value of the spin image for this part. For example, if a pixel value of a first line of the spin image is obtained based on the image of the first line of the first backscattered electron image and the image of the second line of the second backscattered electron image, and a pixel value of a fifth line of the spin image is obtained based on an image of a fifth line of the first backscattered electron image and an image of a sixth line of the second backscattered electron image (a line for which a pixel value is calculated based on these backscattered electron images is called an actual calculation line), pixel values of second to fourth lines of the spin image can be obtained by performing weighted averaging based on a distance between lines between the pixel value of the first line and the pixel value of the fifth line, which are actual calculation lines. A line for which a pixel value is obtained by performing interpolation based on pixel values of actual calculation lines is called an interpolation line.

Third Embodiment

A third embodiment is another spin image acquisition method in which an image acquisition time can be shortened. The third embodiment is an effective method when it can be assumed that an absolute value of magnetization is constant in a material. When an X component of magnetization M is defined as $M_x$, and a Y component of the magnetization M is defined as $M_y$, if an absolute value |M| of the magnetization M is constant, $|M|^2 = |M_x|^2 + |M_y|^2$ is also constant, and thus a spin image acquisition time is shortened by using this relation. The case in which it can be assumed that the absolute value of the magnetization is constant in the material corresponds to, for example, a case in which a magnetic recording medium is used as an observation sample. The magnetic recording medium generally has the same absolute value of magnetization at any position of the medium, and stores information by changing a magnetization direction.

Figure 8:
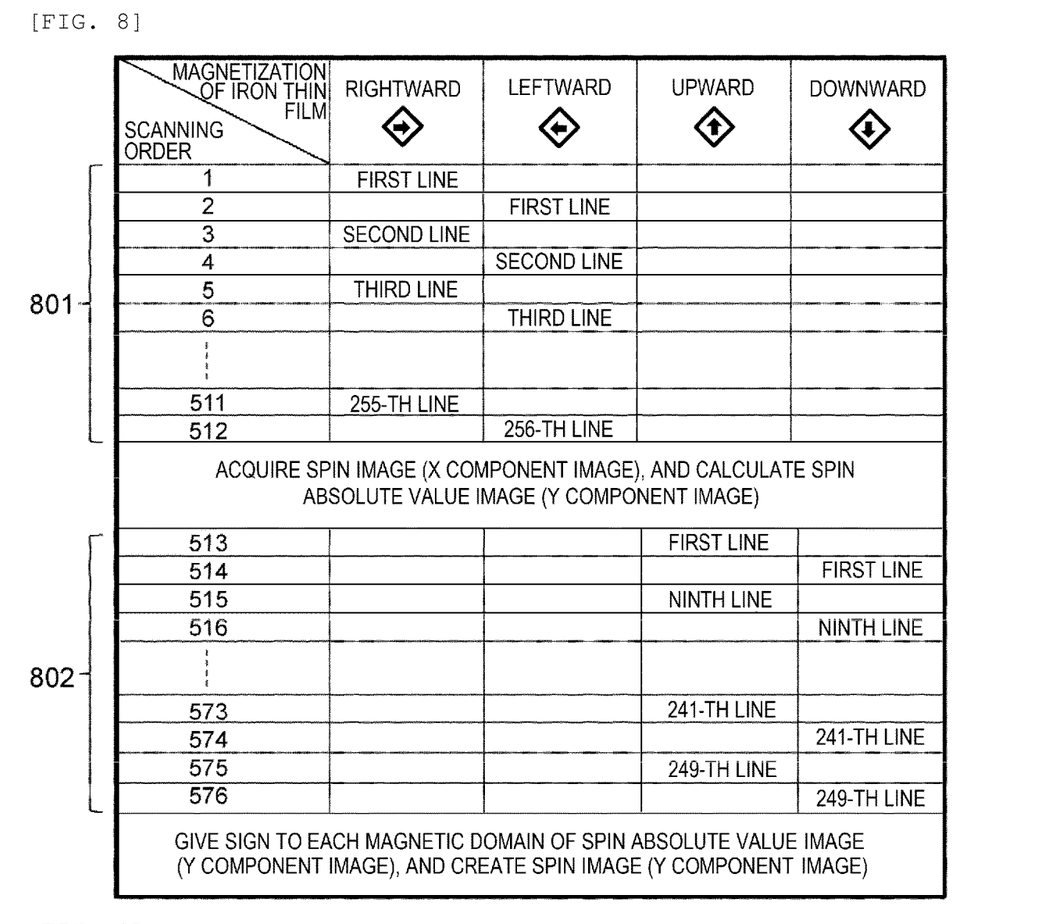
FIG. 8 is a diagram illustrating a spin image acquisition method according to a third embodiment.

A spin image acquisition method according to the third embodiment will be described with reference to FIG. 8. The third embodiment is the same as the first embodiment and the second embodiment in that magnetization control of an iron thin film and scanning on a sample are synchronized, and a magnetization direction of the iron thin film is switched for scanning of every line, but the scanning is performed twice on an observation visual field. By scanning in a first scanning period 801 in which the observation visual field is scanned for a first time, a spin image in a first direction (here, an X direction) is acquired, and a spin absolute value image in a second direction (here, a Y direction) is acquired by using the relation described above. In the spin absolute value image in the Y direction obtained here, only the absolute value is plotted, and a value of each point cannot be given a sign. Therefore, in a second scanning period 802 in which the observation visual field is scanned for a second time, positive and negative signs of the magnetization in each magnetic domain of the spin absolute value image in the second direction are determined by scanning thinned-out from the scanning in the first scanning period 801, and a spin image in the second direction is acquired by using the spin absolute value image and the determined signs of the magnetization.

Figure 9A:
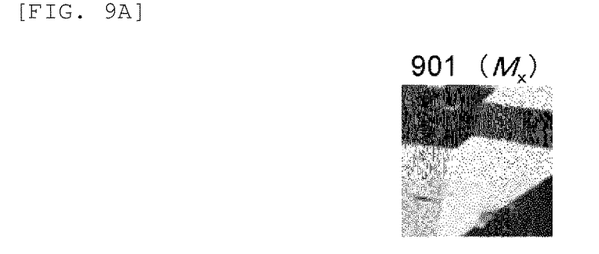
FIG. 9A is a schematic diagram of a spin image (an X component image) in the third embodiment.
Figure 9B:
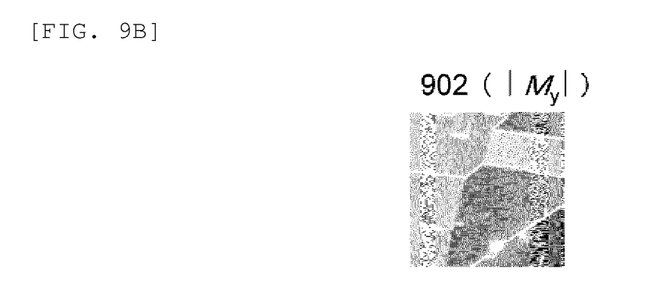
FIG. 9B is a schematic diagram of a spin absolute value image (a Y component image) in the third embodiment.

First, in the first scanning period 801, the magnetization direction of the iron thin film is switched leftward and rightward for each scanning line to acquire a first backscattered electron image and a second backscattered electron image. In the example illustrated in FIG. 8, a scanning method in the first scanning period 801 is the same as the scanning method according to the first embodiment. FIG. 9A illustrates a spin image (an X component image) 901 obtained based on the first backscattered electron image and the second backscattered electron image in the same manner as in the first embodiment. By using the relation that $|M_x|^2 + |M_y|^2$ is constant, $|M_y|$ in each pixel can be calculated. FIG. 9B illustrates a spin absolute value image (a Y component image) 902 thus obtained.

Figure 9C:
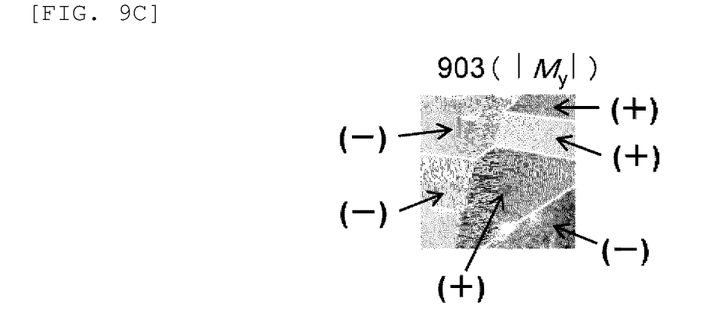
FIG. 9C is a schematic diagram (with signs) of the spin absolute value image (the Y component image) in the third embodiment.
Figure 9D:
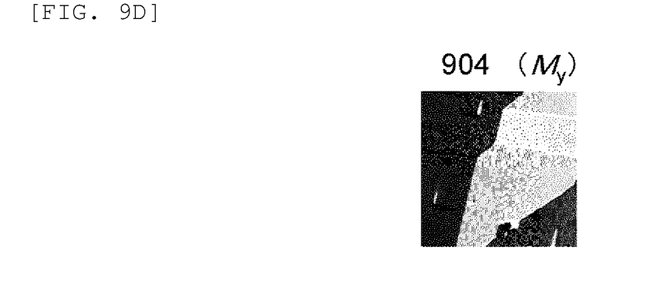
FIG. 9D is a schematic diagram of a spin image (a Y component image) in the third embodiment.

Subsequently, in the second scanning period 802, the magnetization direction of the iron thin film is switched upward and downward for each scanning line to acquire a third backscattered electron image and a fourth backscattered electron image. In the second scanning period 802, the number of lines of scanning is smaller than that in the first scanning period 801. The number of lines of scanning in the second scanning period 802 is set to a value sufficient enough for determining whether a magnitude of the magnetization of each magnetic domain is positive or negative in the spin absolute value image illustrated in FIG. 9B. FIG. 9C illustrates a spin absolute value image (a Y component image) 903 in which signs of the respective magnetic domains determined based on the third backscattered electron image and the fourth backscattered electron image are written. A spin image (a Y component image) 904 illustrated in FIG. 9D can be obtained by giving a sign corresponding to the magnetic domain to each pixel value in the spin absolute value image. Regarding a timing of image processing such as creation of the spin image (the X component image), it is not necessary to perform the image processing between the first scanning period 801 and the second scanning period 802, and all image processing may be performed after a series of scanning illustrated in FIG. 8 are performed.

Fourth Embodiment

The first to third embodiments are embodiments in which a backscattered electron image is formed by repeating line scanning on an observation visual field. The backscattered electron image of a sample which is an observation target is generally an image with little change, and it is known that, in such a case, clear image data can be restored from a small amount of sampling data by using sparsity of an image (sparse modeling, compressed sensing). In a fourth embodiment, a clear backscattered electron image is obtained based on a small amount of sampling data to obtain a spin image. Accordingly, the number of times of sampling can be significantly reduced and an image acquisition time can be shortened as compared with a case in which line scanning is performed as in the first to third embodiments.

First, sampling points for acquiring detection signals in the observation visual field are determined. The number of sampling points is determined according to a desired resolution of image data. In order to restore clear image data, it is desirable that the sampling points are randomly and two-dimensionally dispersed in the observation visual field, but in order to facilitate sampling, arrangement of the sampling points may be regular. A sampling method for acquiring the detection signal at the predetermined sampling point will be described below.

(First Sampling Method)

The control unit 217 synchronizes magnetization control of the iron thin film 207 and control of the scanning coil 219 for moving an irradiation position of the primary electron beam 202 to the sampling point, and switches a magnetization direction of the iron thin film leftward, rightward, upward, and downward for each sampling point to acquire a detection signal. The sparse modeling is applied to a detection signal acquired with the rightward direction as the magnetization direction of the iron thin film 207 at each sampling point, and a first backscattered electron image of the observation visual field is obtained. Similarly, a second backscattered electron image is obtained based on a detection signal acquired with the leftward direction as the magnetization direction of the iron thin film 207 at each sampling point, a third backscattered electron image is obtained based on a detection signal acquired with the upward direction as the magnetization direction of the iron thin film 207 at each sampling point, and a fourth backscattered electron image is obtained based on a detection signal acquired with the downward direction as the magnetization direction of the iron thin film 207 at each sampling point. There is almost no influence of drift or background noise due to an overtime change between the detection signals acquired by switching the magnetization direction of the iron thin film at each sampling point. For this reason, there is almost no influence of drift or background noise due to the overtime change among the first to fourth backscattered electron images restored based on the data. Therefore, by performing the calculation described with reference to FIGS. 4A to 4C on the first to fourth backscattered electron images, spin images (an X component image and a Y component image) with a high S/N ratio can be obtained.

(Second Sampling Method)

The control unit 217 synchronizes the magnetization control of the iron thin film 207 and the control of the scanning coil 219 for moving the irradiation position of the primary electron beam 202 to the sampling point, and switches the magnetization direction of the iron thin film leftward, rightward, upward, and downward for each set of sampling points that are close to each other to acquire a detection signal.

Figure 10:
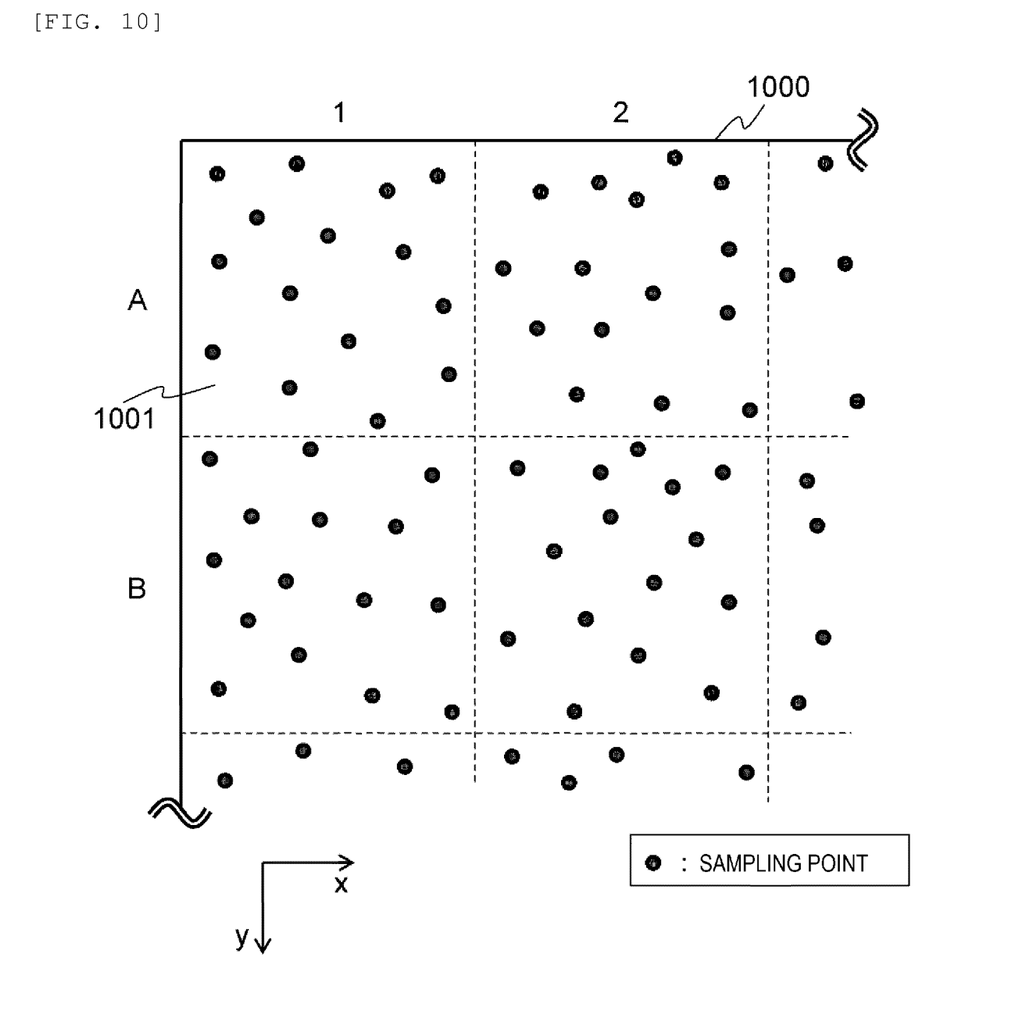
FIG. 10 is a diagram schematically illustrating a state of sampling points arranged in an observation visual field in a fourth embodiment.

FIG. 10 schematically illustrates a state of the sampling points (indicated by black circles) arranged in an observation visual field 1000. Here, the observation visual field 1000 is divided by a mesh with i (integer) parts in an x direction and k (integer) parts in a y direction, each of divided visual fields is called a partial observation visual field, and is distinguished by coordinates. For example, a partial observation visual field 1001 is expressed as a partial observation visual field (1, A). As illustrated in the figure, a position in the x direction is specified by a numeral, and a position in the y direction is specified by an alphabet. It is assumed that each partial observation visual field includes n sampling points.

Figure 11:
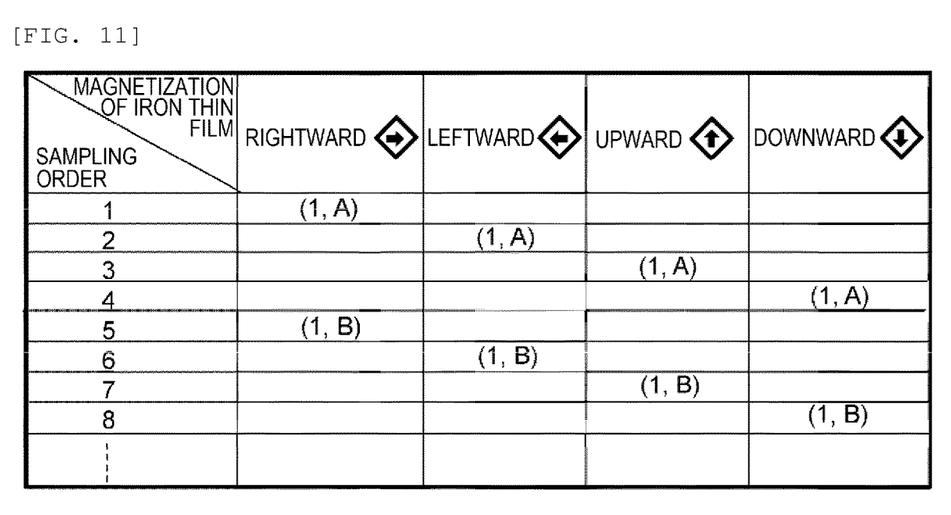
FIG. 11 is a diagram illustrating a second sampling method according to the fourth embodiment.

The second sampling method in the fourth embodiment will be described with reference to FIG. 11. In the second sampling method, the magnetization direction of the iron thin film 207 is switched leftward, rightward, upward, and downward for each set of sampling points included in the partial observation visual field. Here, when a detection signal (hereinafter, referred to as a first detection signal) is acquired at a sampling point included in a partial observation visual field with a first direction as the magnetization direction of the iron thin film 207, and then a detection signal (hereinafter, referred to as a second detection signal) is acquired at a sampling point included in the same partial observation visual field by switching the magnetization direction of the iron thin film 207 to a direction opposite to the first direction, a size of the partial observation visual field is determined to be a size that allows influences of drift and background noise due to an overtime change between the first detection signal and the second detection signal being reduced to a negligible level. Therefore, the influences of drift and background noise due to the overtime change between the detection signals acquired by switching the magnetization direction of the iron thin film at the sampling point of each partial observation visual field are reduced to a negligible level. For this reason, as in the case of the first sampling method, it is possible to neglect the influences of the drift and the background noise due to the overtime change among the first to fourth backscattered electron images restored based on the data acquired by switching the magnetization direction of the iron thin film at each sampling point. Therefore, in the case of the second sampling method, spin images (the X component image and the Y component image) with a high S/N ratio can also be obtained by performing the calculation described with reference to FIGS. 4A to 4C on the first to fourth backscattered electron images.

Although an example in which the partial observation visual fields are defined by dividing with a mesh has been described, the method for defining the partial observation visual fields is not limited thereto. The numbers of sampling points included in the partial observation visual fields may not be the same. It is necessary to reduce the influences of the drift and the background noise due to the overtime change between the first detection signal and the second detection signal to a negligible level even with a maximum number of times of sampling. A position of the sampling point at which the first detection signal is acquired and a position of the sampling point at which the second detection signal is acquired may be different from each other in the partial observation visual field. First to fourth partial backscattered electron images may be obtained for each partial observation visual field, and partial spin images (an X component image and a Y component image) corresponding to the partial observation visual field may be sequentially obtained.

The invention has been described with reference to the four embodiments. The embodiments may be modified in various ways without departing from the gist of the invention, and may be used in combination. For example, the third embodiment and the second embodiment may be combined, and scanning may be performed while shifting the scanning position in the first scanning period 801.

REFERENCE SIGNS LIST

101: iron thin film
102: magnetization direction
103: electron to be measured
104: spin
105: backscattered electron
106: electron detector
201: electron gun column
202: primary electron beam
203: sample
204: secondary electron flux
205: spin detector chamber
206: secondary electron transfer lens
207: iron thin film
208: coil
209: backscattered electron
210: electron detector
211: detection signal
212: AD converter
213: data analysis unit
214: display device
215: spin image (X component image)
216: spin image (Y component image)
217: control unit
218: scanning signal
219: scanning coil 220: iron thin film magnetization control signal
221: iron thin film magnetization control power supply
401, 601: first backscattered electron image
402, 602: second backscattered electron image
403, 603: periodic noise
404, 604: defect on sample surface
405, 605: foreign matter on sample surface
406, 606: spin image (X component image)
801: first scanning period
802: second scanning period
901: spin image (X component image)
902, 903: spin absolute value image (Y component
904: spin image (Y component image)
1000: observation visual field
1001: partial observation visual field

The invention claimed is:

1. A charged particle beam device, comprising:
a charged particle column configured to perform scanning on a sample with a charged particle beam;
a spin detector including an iron thin film, a plurality of coils configured to magnetize the iron thin film, a conveying lens configured to focus, on the iron thin film, secondary electrons emitted from the sample due to irradiation of the charged particle beam, and an electron detector configured to detect backscattered electrons emitted due to the iron thin film being irradiated with the secondary electrons; and
a control unit configured to control switching of a magnetization direction of the iron thin film in synchronization with scanning of one line with the charged particle beam from the charged particle column.

2. The charged particle beam device according to claim 1, further comprising:
an iron thin film magnetization control power supply configured to independently supply an excitation current to each of the plurality of coils, wherein
the control unit is configured to switch the magnetization direction of the iron thin film by controlling an excitation state of the plurality of coils by the iron thin film magnetization control power supply.

3. The charged particle beam device according to claim 1, further comprising:
a data analysis unit, wherein
the magnetization direction of the iron thin film to be switched by the control unit includes a first direction in a main surface of the iron thin film, a direction opposite to the first direction, a second direction different from the first direction in the main surface of the iron thin film, and a direction opposite to the second direction,
the data analysis unit is configured to create a first backscattered electron image based on a detection signal output from the electron detector when the magnetization direction of the iron thin film is the first direction, create a second backscattered electron image based on a detection signal output from the electron detector when the magnetization direction of the iron thin film is the direction opposite to the first direction, create a third backscattered electron image based on a detection signal output from the electron detector when the magnetization direction of the iron thin film is the second direction, create a fourth backscattered electron image based on a detection signal output from the electron detector when the magnetization direction of the iron thin film is the direction opposite to the second direction, and generate a first spin image and a second spin image by using the first to fourth backscattered electron images, and
when an X direction and a Y direction orthogonal to each other are defined, the first spin image represents an X component of the magnetization at an irradiation position of the charged particle beam on the sample, and the second spin image represents a Y component of the magnetization at the irradiation position of the charged particle beam on the sample.

4. The charged particle beam device according to claim 3, wherein
the control unit is configured to repeat the scanning of one line at the same position with the charged particle beam from the charged particle column while switching the magnetization direction of the iron thin film.

5. The charged particle beam device according to claim 4, wherein
the control unit is configured to
repeat scanning of an i-th line (i: integer) with the charged particle beam from the charged particle column while switching the magnetization direction of the iron thin film in an order of the first direction, the direction opposite to the first direction, the second direction, and the direction opposite to the second direction, and
thereafter, repeat scanning of an (i+1)-th line with the charged particle beam from the charged particle column while switching the magnetization direction of the iron thin film in the order of the first direction, the direction opposite to the first direction, the second direction, and the direction opposite to the second direction.

6. The charged particle beam device according to claim 3, wherein
the control unit is configured to perform the scanning of one line with the charged particle beam from the charged particle column while shifting a position.

7. The charged particle beam device according to claim 6, wherein
the control unit is configured to
perform scanning of i-th to (i+3)-th lines (i: integer) with the charged particle beam from the charged particle column by switching the magnetization direction of the iron thin film in an order of the first direction, the direction opposite to the first direction, the second direction, and the direction opposite to the second direction, respectively, and
thereafter, perform scanning of (i+4)-th to (i+7)-th lines with the charged particle beam from the charged particle column by switching the magnetization direction of the iron thin film in the order of the first direction, the direction opposite to the first direction, the second direction, and the direction opposite to the second direction.

8. The charged particle beam device according to claim 6, wherein
the first to fourth backscattered electron images are images subjected to thinning-out scanning, and the second backscattered electron image has a second line having a pixel value in adjacent to a first line at which the first backscattered electron image has a pixel value, and
the first spin image created by the data analysis unit includes an actual calculation line having a pixel value calculated by using the pixel value of the first line of the first backscattered electron image and the pixel value of the second line of the second backscattered electron image, and an interpolation line having a pixel value calculated by interpolation from the pixel value of the actual calculation line.

9. The charged particle beam device according to claim 3, wherein
the control unit is configured to switch the magnetization direction of the iron thin film between the first direction and the direction opposite to the first direction in a first scanning period in which an observation visual field is scanned for a first time, and switch the magnetization direction of the iron thin film between the second direction and the direction opposite to the second direction in a second scanning period in which the observation visual field is scanned for a second time, the number of lines of scanning on the observation visual field in the second scanning period being smaller than the number of lines of scanning on the observation visual field in the first scanning period.

10. The charged particle beam device according to claim 9, wherein
the control unit is configured to repeat the scanning of one line with the charged particle beam from the charged particle column at the same position while switching the magnetization direction of the iron thin film, and
a position of a next line that moves after scanning of a certain line in the second scanning period is farther from the certain line than a position of a next line that moves after the scanning of the certain line in the first scanning period.

11. The charged particle beam device according to claim 9, wherein
the data analysis unit is configured to create the first spin image by using the first backscattered electron image and the second backscattered electron image, generate a spin absolute value image representing an absolute value of the Y component of the magnetization at the irradiation position of the charged particle beam on the sample based on the first spin image, determine a sign for each magnetic domain of the spin absolute value image by using the third backscattered electron image and the fourth backscattered electron image, and create the second spin image by using the spin absolute value image and the sign determined for each magnetic domain of the spin absolute value image.

12. The charged particle beam device according to claim 11, wherein
the sample is assumed to have a constant absolute value of the magnetization.

13. A charged particle beam device, comprising:
a charged particle column configured to emit a charged particle beam to sampling points two-dimensionally dispersed in an observation visual field on a sample;
a spin detector including an iron thin film, a plurality of coils configured to magnetize the iron thin film, a conveying lens configured to focus, on the iron thin film, secondary electrons emitted from the sample due to irradiation of the charged particle beam, and an electron detector configured to detect backscattered electrons emitted due to the iron thin film being irradiated with the secondary electrons; and
a control unit configured to control switching of a magnetization direction of the iron thin film in synchronization with movement of an irradiation position of the charged particle beam by the charged particle column to a sampling point.

14. The charged particle beam device according to claim 13, further comprising:
a data analysis unit, wherein
the magnetization direction of the iron thin film to be switched by the control unit includes a first direction in a main surface of the iron thin film, a direction opposite to the first direction, a second direction different from the first direction in the main surface of the iron thin film, and a direction opposite to the second direction,
the data analysis unit is configured to create a first backscattered electron image based on a detection signal output from the electron detector when the magnetization direction of the iron thin film is the first direction, create a second backscattered electron image based on a detection signal output from the electron detector when the magnetization direction of the iron thin film is the direction opposite to the first direction, create a third backscattered electron image based on a detection signal output from the electron detector when the magnetization direction of the iron thin film is the second direction, create a fourth backscattered electron image based on a detection signal output from the electron detector when the magnetization direction of the iron thin film is the direction opposite to the second direction, and generate a first spin image and a second spin image by using the first to fourth backscattered electron images, and
when an X direction and a Y direction orthogonal to each other are defined, the first spin image represents an X component of the magnetization at an irradiation position of the charged particle beam on the sample, and the second spin image represents a Y component of the magnetization at the irradiation position of the charged particle beam on the sample.

15. The charged particle beam device according to claim 13, wherein
the control unit is configured to perform control such that a detection signal output from the electron detector is acquired by switching the magnetization direction of the iron thin film at a first sampling point, and after moving to a second sampling point, a detection signal output from the electron detector is acquired by switching the magnetization direction of the iron thin film at the second sampling point.

16. The charged particle beam device according to claim 13, wherein
the control unit is configured to perform control to acquire a detection signal output from the electron detector with a first direction as the magnetization direction of the iron thin film for a set of first sampling points, and acquire a detection signal output from the electron detector by switching the magnetization direction of the iron thin film to a direction opposite to the first direction for the set of first sampling points.

17. The charged particle beam device according to claim 13, wherein
the observation visual field is divided into a plurality of partial observation visual fields, and
the control unit is configured to perform control to acquire a detection signal output from the electron detector with a first direction as the magnetization direction of the iron thin film for a set of sampling points included in a first partial observation visual field, and acquire a detection signal output from the electron detector by switching the magnetization direction of the iron thin film to a direction opposite to the first direction for the set of sampling points included in the first partial observation visual field.

18. The charged particle beam device according to claim 17, wherein
a position of the set of sampling points included in the first partial observation visual field when the magnetization direction of the iron thin film is the first direction is different from a position of the set of sampling points included in the first partial observation visual field when the magnetization direction of the iron thin film is the direction opposite to the first direction.

\* \* \* \* \*